INVENTORS
JAMES H. BUTLER
SAMUEL S. IM
THOMAS L. PALFI

BY David W. Koffsky
ATTORNEY

United States Patent Office 3,365,620
Patented Jan. 23, 1968

3,365,620

CIRCUIT PACKAGE WITH IMPROVED MODULAR ASSEMBLY AND COOLING APPARATUS

James H. Butler and Samuel S. Im, Poughkeepsie, and Thomas L. Palfi, Yorktown Heights, N.Y., assignors to International Business Machines Corporation, Armonk, N.Y., a corporation of New York Filed June 13, 1966, Ser. No. 557,086
10 Claims. (Cl. 317—101)

ABSTRACT OF THE DISCLOSURE

A circuit modular assembly with a first circuit board having semi-conductor devices disposed in apertures. A second circuit board overlies the first circuit board with means interconnecting the semi-conductor devices with the first and second circuit boards. Cooling means are positioned adjacent one face of the first circuit board for maintaining the temperature of all said semi-conductor devices at substantially the same level.

This invention relates to electronic packaging and more particularly to an electronic packaging arrangement for high speed data processing circuits.

In the data processing industry great stress is laid upon the speed of operation of a machine. This factor determines the amount of work output available from the machine over a predetermined period of time and is a measure of its effectiveness in relation to competitive equipment. As a result, continual effort is expended to better the operating speeds of new families of data processing machines.

Utilizing recent circuit developments, it is now possible to plan, design, and build machines with stage to stage logic decision signal delays in the order of nanoseconds ($10^{-9}$ seconds). One development, in particular, that has made this advance possible is the monolithic integrated circuit. The extremely small physical size of a single integrated circuit chip, in and of itself, significantly reduces the signal delay time between the discrete circuits embodied on a chip and renders a nanosecond logic technology possible. Nevertheless, the production of a data processing system capable of operating with logic decision delays in the low nanosecond range (e.g. 2 nanoseconds) requires more than just monolithic integrated circuits alone. A packaging arrangement must be provided which accommodates a number of individual chips, which is able to dissipate large amounts of heat; which provides sufficient interior interconnections to minimize input-output terminals; which provides small signal delays between integrated circuit chips; and which prevents disturbances occurring in one circuit from propagating to other circuits.

To provide some numbers which indicate the magnitude of the problems posed by the above requirements, the physical constants inherent in a two nanosecond integrated circuit technology are exemplary. The signal delay through any discrete logic circuit in a two nanosecond technology cannot exceed .7 nanosecond; the delay due to loading —.7 nanosecond and the packaging delay (time required for the signal to travel from circuit to circuit), no more than .6 nanosecond. The latter requirement restricts the average interconnection length between serially connected circuits to approximately .2–.3 inch. Thus, in a machine which employs 40,000–100,000 circuits, the required circuit density is at least 100 circuits per square inch.

The cooling problem with such circuit densities is realized when it is known that each circuit dissipates approximately 100 milliwatts. Thus, with one hundred circuits per square inch, the power density is 10 watts per square inch—which is a higher per unit area power dissipation than is provided by the normal household toaster.

Wiring densities in such a package are extremely tight and conductor spacings are measured in thousandths of an inch as are the conductor dimensions. With such small cross sections, extremely low resistance electrical conductors, typically printed circuit materials with extreme dimensional stability, are required. Signal rise times in such a technology occupy only fractions of a nanosecond and thus must be handled as ultra high frequency signals. As a result, all of the conductor systems in such a technology must be constructed as transmission lines with closely controlled dielectric spacings between ground planes and conductor lines to provide known line impedances. Care must also be taken to prevent conductor cross-talk. The dielectric material, in addition to providing the desired insulating effect, must also possess an extremely low dielectric constant to allow maximum signal propagation speeds. In the power distribution circuitry, power disturbances induced into the power supply system by one circuit must not be allowed to affect the operation of adjoining circuits. This requires decoupling which generally employs high value shunt capacitors. Such devices require physical space and are not easily provided in an integrated circuit environment.

Presently known monolithic integrated circuit packaging techniques, accommodate only a single chip per individual package. This type of package negates much of the size advantage gained by the use of the monolithic technology.

Accordingly, it is an object of this invention to provide an improved circuit package.

It is another object of this invention to provide an improved circuit package adapted for use with high speed data processing circuits.

Still another object of this invention is to provide an improved circuit package adapted to handle high levels of power dissipation.

Yet another object of this invention is to provide an improved circuit package adapted to house a plurality of monolithic integrated circuits in close proximity.

A still further object of this invention is to provide a circuit package which is adapted to maintain a plurality of monolithic integrated circuits at substantially the same temperature.

In accordance with the above stated objects, a circuit package is provided which includes a first apertured circuit board with semiconductor devices positioned in each aperture. A second circuit board is positioned adjacent one face of the apertured circuit board and interconnected therewith. A cooling means is positioned on the other face of the apertured circuit board and physically connects to the various semiconductor devices to disseminate the heat generated by the devices. By employing two separate circuit boards as above described, one is utilized to transmit power supply voltages and has the decoupling constructed integral thereto while the other circuit board is constructed with suitably low dielectric constant insulation to supply the signal interconnections.

The foregoing and other objects features and advantages of the invention will be apparent from the following more particular description of the preferred embodiment of the invention, as illustrated in the accompanying drawings.

Figure 1A:
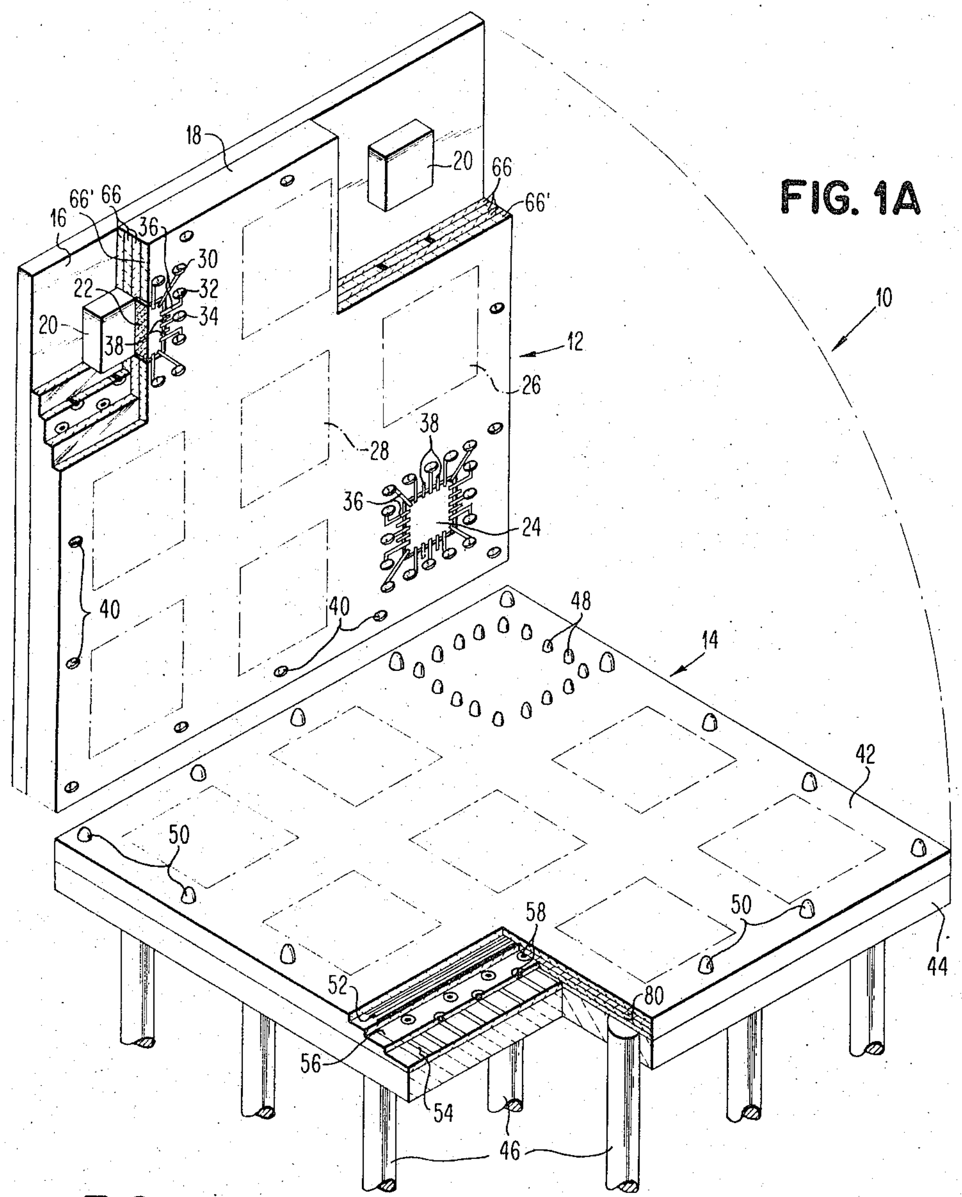
FIG. 1A is an isometric view of the circuit module with its upper portion rotated to expose the underside thereof.

Referring now to FIG. 1A, circuit module 10 comprises two sections, chip holder and power distribution section 12 and signal interconnection and pin section 14. Section 12 has been removed and rotated to better show the interior construction of the module. Chip carrier and power distribution section 12 is comprised of two main portions, a metal cooling plate 16 and a multilayer apertured circuit board 18. Cooling plate 16 is provided with a plurality of pedestals 20, each of which supports a monolithic integrated circuit chip 22, 24, etc. (Other chip areas are shown merely by dotted outlines 26, 28, etc.) While nine chip areas are shown, it should be realized that the size of module 10 can be varied to accommodate as many or as few chips as required.

Each pedestal and its associated chip (e.g. 22) nests within an aperture in multilayer printed circuit board 18. The upper face of monolithic chip 22 is substantially coplanar with the upper face of circuit board 18. A plurality of recessed contact sockets 30, 32, 34, etc. are disposed on the surface of circuit board 18 and are interconnected with the upper face of monolithic integrated circuit chip 22 via interconnecting conductors 36. The recessed contact sockets and their associated conductors provide access to the various signal conductors and devices on chip 22. A plurality of shorter interconnecting conductors 38 provide power interconnections between circuit board 18 and chip 22. Additional recessed contact sockets 40 are disposed about the edge of board 18 and provide power interconnections between sections 12 and 14 of module 10.

Lower section 14 of module 10 provides signal interconnections between various ones of monolithic integrated circuit chips 22, 24, etc. Section 14 comprises three main portions, multilayer circuit board 42, a stiffener plate 44 and a plurality of interconnecting pins 46. A plurality of signal studs 48 and power studs 50 are emplaced on the upper surface of multilayer circuit board 42. Each power and signal stud mates with a like recessed contact socket when section 12 is brought down upon and mated with section 14 of module 10. The height of signal studs 48 and power studs 50 may be made sufficient to provide an offset of section 12 from section 14 to thereby prevent the two sections from contacting each other, thus preventing any interaction between the power and signal circuit. Each of studs 48 and 50 is connected via a through hole or connection to an interior portion of circuit board 42. Circuit board 42 has two signal interconnection layers 52 and 54, with conductor lines running in the X direction on layer 52, and in the Y direction on layer 54. (Of course, additional layers of signal interconnections can be provided.) A grounded shielding plane 56 is interposed between signal planes 52 and 54 and interconnections between the planes are provided via through hole connectors 58.

Stiffener plate 44 provides structural rigidity for multilayer circuit board 42 and additionally provides support for pins 46. Each of pins 46 makes connection to one of the circuit lines on circuit layer 54.

Figure 1B:
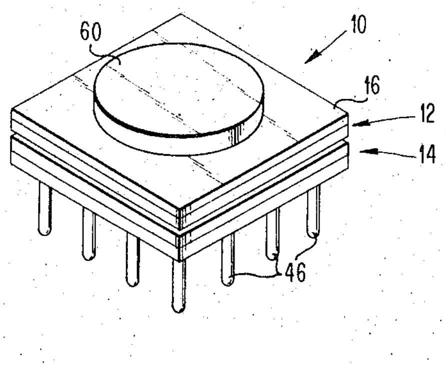
FIG. 1B is an isometric view of the invention in its completely assembled form.

The completely assembled package is shown in FIG. 1B. Cooling plate 16 is provided with an extended portion 60 (not shown in FIG. 1A) to allow for its insertion into a cooling structure (to be hereinafter discussed in regards to FIG. 3).

Figure 2:
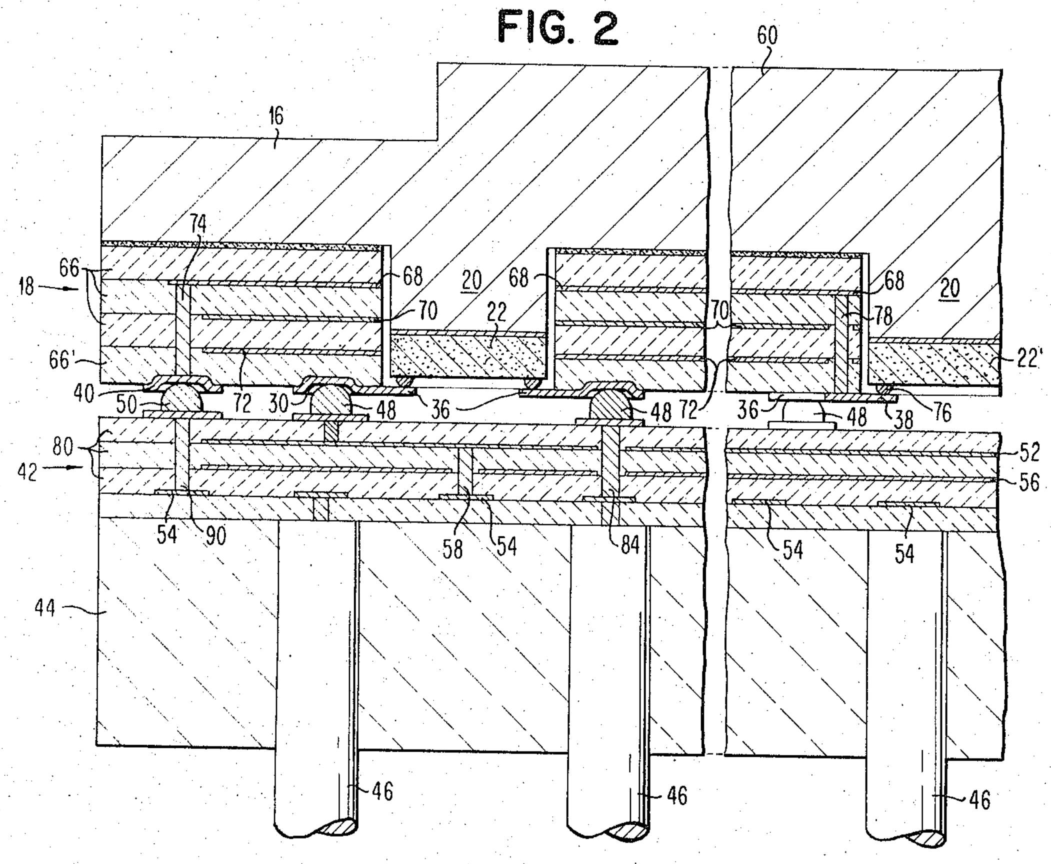
FIG. 2 is a sectional view of the completely assembled module shown in FIG. 1B.

Referring now to FIGS. 1A and 2 together, each section of module 10 will be described in greater detail in relation to its structure and function. Cooling plate 16 is preferably fabricated from a material whose coefficient of thermal expansion is substantially similar to that of the material of monolithic integrated circuit chip 22 (e.g. silicon). Additionally the cooling plate material must also have a low thermal resistance to thereby allow efficient transfer of heat away from chip 22. A metal, such as molybdenum fulfills both of these requirements.

Chip 22 is bonded back-down to pedestal 20. This configuration achieves a maximum heat transfer from chip 22 through pedestal 20, cooling plate 16 and extended portion 60. The bond between pedestal 20 and chip 22 may be any of a number of well known types, but one which is preferred, employes the initial emplacement of a thin layer of gold on the back of chip 22. When the gold backed surface of chip 22 and pedestal 20 are then brought into contact and heated, a silicon-gold eutectic bond occurs between the chip and pedestal. This type of bond has good heat transfer and strength characteristics.

If it is desired to electrically isolate cooling plate 16 and pedestal 20 from the cooling apparatus, a thermally conductive, electrically insulating layer (not shown) may be interposed between main cooling plate 16 and upper section 60. Such an interposed layer may comprise a thin alumina slab whose surfaces have been previously metalized and which is interposed and bonded between the two sections of the cooling plate. The alumina slab will both electrically insulate the sections of the cooling plate and additionally provide good heat transfer therebetween.

The power distribution and decoupling system for chips 22 is provided through apertured circuit board 18. Circuit board 18 is a multilayer structure which includes interposed layers of ceramic material 66 and metalization layers 68, 70, and 72. Ceramic material 66 is preferably a high dielectric constant material such as barium titanate. Metalization layers 68 and 72 provide power interconnections between various ones of the chips and power socket 40. Socket 40 is interconnected with either layer 68 or 72 by conductive through-holes similar to that shown at 74. Each chip (e.g. 22') is interconnected to the power distribution circuitry via a conductor 38 which interconnects land 76 on chip 22' with through-hole conductor 78 which in turn connects to power distribution plane 68.

Metalization layer 70 is connected (not shown) to a source of reference potential and provides a ground plane for voltage distribution layers 68 and 72. This construction provides a high capacity, built-in decoupling network for each of voltage distribution layers 68 and 72. For example, if a circuit on one of chips 22 induces a voltage disturbance on metalization layer 72, the high capacitance which exists between metalization layer 72 and ground plane 70 effectively absorbs such disturbances.

As above stated each chip 22 is interconnected to multilayer circuit board 18 by a plurality of jumper type conductors. A number of interconnection techniques can be be employed to provide these interconnections, but one which is preferred is a decal interconnection technique described in copending U.S. patent application 533,073 of Chance et al., assigned to the same assignee as this application. Briefly, a decal backing sheet is provided with a plurality of conductive strips. The decal is placed face down over the surface of each semiconductor chip in such a manner that the conductive strips align with the lands on the chip and the sockets on the circuit board. A bonding head then is brought down through the backing sheet to interconnect the conductive strips with the respective land and connective areas. The decal backing sheet is then removed leaving the conductive strips firmly bonded and to the contact areas and bridging the space between the chips and the circuit board.

To prevent capacitive losses from occurring between signal sockets 30, 32, etc. and underlying metalization area 72, ceramic material 66' which lies therebetween may be comprised of a material with a low dielectric constant such as an alumina or a zirconium alkaline earth porcelain material. Such materials have low dielectric constants and prevent the occurrence of any significant capacitance between the sockets and underlying metalization areas.

Signal interconnections between the various monolithic integrated circuit chips 22, 22', etc. are provided through multilayer printed circuit board 42. The material utilized as insulation between the metalization layers in circuit board 42 must have an extremely low dielectric constant, to reduce to as low a level as possible the distributed capacitance along the signal lines. Alkaline earth porcelain ceramics have a dielectric constant of approximately 5 and are suitable for such use. While some organic materials e.g. such as Teflon (a trademark of the Du Pont Co.) have a dielectric constant as low as 2.2, ceramic materials offer much better mechanical tolerances than do organics. For instance in Teflon-copper cards, plated-through holes can be placed .05 inch apart whereas in ceramic materials, through-holes of .004 inch diameter can be placed on .008 inch centers. As a result, much higher packaging densities are presently available from ceramic materials and dictate their use in such packages.

Metalization layer 52 provides X dimension interconnections whereas metalization layer 54 provides Y dimension interconnections. Through-hole connectors such as that shown at 58 provide interconnections between the X and Y wiring coordinates, with like through-hole connectors at 84 providing interconnections between certain of the wiring coordinates and exterior interconnecting studs 48. A ground plane 56 separates signal interconnection layers 52 and 54 and provides the required characteristic impedance for each of these metalization layers. In specific, the thickness of dielectric material 80 is closely controlled to achieve a desired characteristic impedance for metalization layers 52 and 54 and prevent signal interaction therebetween.

Pins 46 extend through stiffener plate 44 and connect via through-hole connectors to metalization layer 54, thereby providing the desired power and signal interconnections to the other modules. Power connections to power studs 50 are made via through-hole connectors (e.g. 90) to metalization layer 54, which is in turn connected to one of pins 46 (not shown).

As can be seen from the above module description, the separation of the power distribution and signal interconnection functions into separate circuit boards allows decoupling to be built directly into the power distribution network and controlled impedance circuit lines to be constructed in the signal carrying portion. Additionally, mounting the chips interior to the circuit board and removing the heat in one direction while providing signal interconnections in the other, provides for extremely efficient space utilization and high packaging density. Moreover, the single cooling plate maintains all of the chips at substantially the same temperature; an important factor in component tracking.

Figure 3:
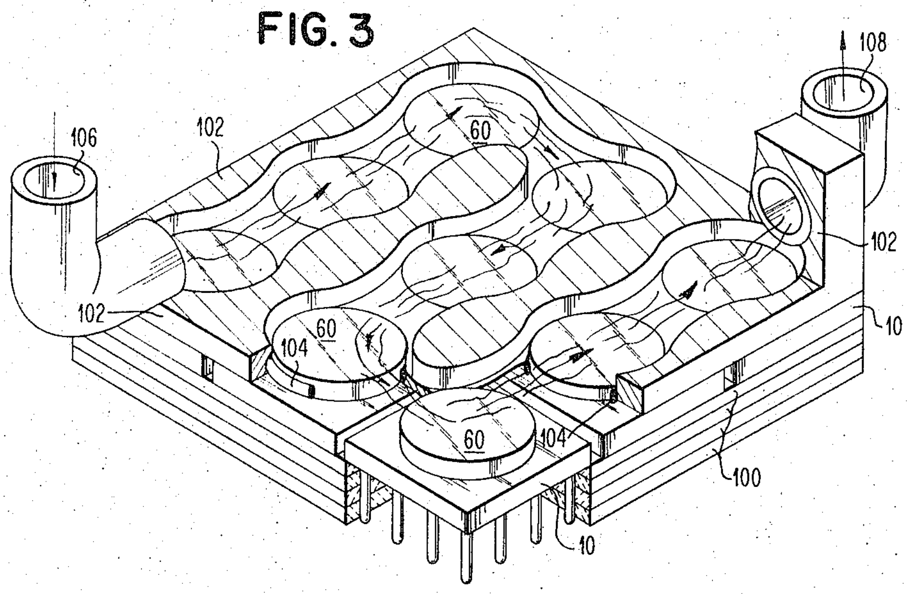
FIG. 3 is an isometric view showing an assembly of modules and cooling means therefor.

Referring now to FIG. 3, a plurality of modules 10 are shown plugged into a multilayer circuit board 100. A water cooling manifold 102 (with its top broken away) fits directly over the modules and has orifices provided therein which accept cooling plate section 60. Surrounding each coating plate section 60 is an O-ring 104 which prevents the liquid coolant from escaping. Inlet 106 provides the coolant fluid which flows over the top of cooling plate sections 60 and carries the heat away therefrom via outlet port.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In a device of the character described, the combination comprising;

a first apertured circuit board having a pair of faces,
a semiconductor device positioned in each said aperture,
a second circuit board positioned adjacent one face of said first circuit board,
means interconnecting said semiconductor devices with said first and second circuit boards, and
cooling means positioned adjacent the other face of said first circuit board for maintaining the temperature of all said semiconductor devices at substantially the same level.

2. The invention as in claim 1 wherein said first apertured circuit board includes an insulating material having a high dielectric constant and is adapted to distribute power supply voltages.

3. The invention as in claim 2 wherein said apertured circuit board comprises a plurality of power supply distribution layers with reference potential layers interspersed therebetween, each power supply layer comprising a conductive material positioned upon said high dielectric constant insulating material.

4. The invention as in claim 3 wherein said second circuit board includes an insulating material having a low dielectric constant and is adapted to distribute signal voltages.

5. The invention as in claim 4 wherein said second circuit board comprises a multiplicity of signal layers interspersed with reference potential layers each signal layer comprising a highly conductive material located upon a sheet of low dielectric constant insulating material.

6 The invention as in claim 5 wherein said cooling means comprises a high thermal conductivity material which is bonded in common to all said semiconductor devices.

7. The invention as in claim 6 wherein said cooling means comprises a plate provided with a plurality of pedestals, each said pedestal extending into an aperture in said first circuit board and having a semiconductor device bonded thereto.

8. The invention as defined in claim 7 wherein said interconnecting means prevents said first and second circuit boards from physically contacting each other while simultaneously providing electrical interconnections therebetween.

9. The invention as in claim 8 wherein signal interconnection means are provided on the face of said second circuit board which is opposite to that adjacent said first apertured circuit board.

10. The invention as in claim 3 wherein the face of said apertured circuit board which is opposite said second circuit board is provided with a layer of low dielectric constant insulating material upon which a portion of said interconnecting means are located, whereby the high capacitance of the power distribution system is isolated from the signal interconnection system.

References Cited

UNITED STATES PATENTS 3,239,719 3/1966 Shower ------------ 317—101

ROBERT K. SCHAEFER, *Primary Examiner.*

J. R. SCOTT, *Assistant Examiner.*